(12) United States Patent
Murtagian et al.

(10) Patent No.: US 10,522,450 B1
(45) Date of Patent: Dec. 31, 2019

(54) PILLAR BASED SOCKET

(71) Applicant: Intel Corporation, Santa Clara, CA (US)

(72) Inventors: Gregorio Murtagian, Phoenix, AZ (US); Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/159,861

(22) Filed: Oct. 15, 2018

(51) Int. Cl.
*H01L 23/02* (2006.01)
*H01L 23/498* (2006.01)
*H01L 23/528* (2006.01)
*H01L 23/00* (2006.01)

(52) U.S. Cl.
CPC .. *H01L 23/49816* (2013.01); *H01L 23/49838* (2013.01); *H01L 23/528* (2013.01); *H01L 24/17* (2013.01)

(58) Field of Classification Search
CPC .............. H01L 21/743; H01L 21/6898; H01L 23/5226; H01L 23/535
USPC ........................................ 257/678, 686, 777
See application file for complete search history.

(56) References Cited

U.S. PATENT DOCUMENTS

| | | | |
|---|---|---|---|
| 2005/0117296 A1* | 6/2005 | Wu | H01L 23/4093 361/697 |
| 2007/0096760 A1* | 5/2007 | Cheng | G01R 1/0483 324/756.05 |
| 2009/0057881 A1* | 3/2009 | Arana | H01L 23/473 257/714 |
| 2016/0181169 A1* | 6/2016 | Huang | H01L 23/13 257/772 |
| 2016/0181231 A1* | 6/2016 | Lin | H01L 21/565 257/686 |

* cited by examiner

*Primary Examiner* — S. V. Clark
(74) *Attorney, Agent, or Firm* — Schwegman Lundberg & Woessner, P.A.

(57) ABSTRACT

An electronic device may include a semiconductor package, that may include a package substrate. The package may include a semiconductor die. A plurality of package interconnects may include a first pillar extending from a surface of the package substrate. The electronic device may include a socket that may be configured to couple with the semiconductor package. The socket may include a plurality of socket interconnects configured to engage with the package interconnects. The plurality of socket interconnects may include a first contact, and the first contact may include an arm. The arm of the first contact may be configured to engage with the first pillar, and the arm may be configured to laterally displace when engaged with the first pillar. The engagement of the arm with the first pillar may establish an electrical communication pathway between the semiconductor package and the socket.

20 Claims, 7 Drawing Sheets

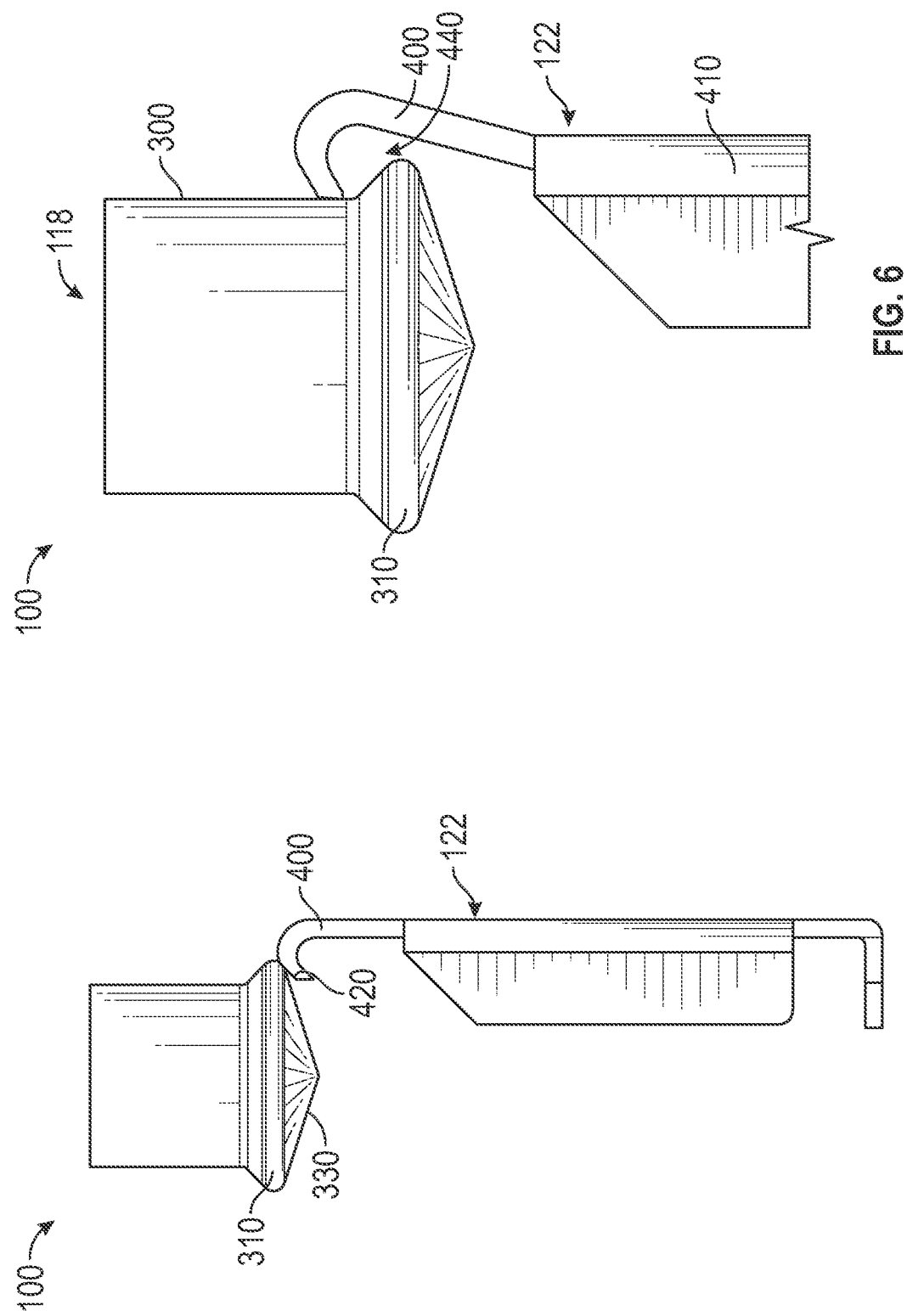

PILLAR BASED SOCKET

BACKGROUND

Electronic devices may include one or more semiconductor die coupled to a package. In some examples, the package may be coupled to a socket. A coupling member may be engaged with the package and coupled to the socket or the motherboard. The coupling member may provide an external enabling force between the package and the socket, and the external enabling force facilitates the electrical interconnection (and communication) between the package and the socket.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 illustrates a side view of the contact engaged with the pillar.

FIG. 6 illustrates a side view of the contact laterally displaced and engaged with the pillar.

DETAILED DESCRIPTION

Figure 1:
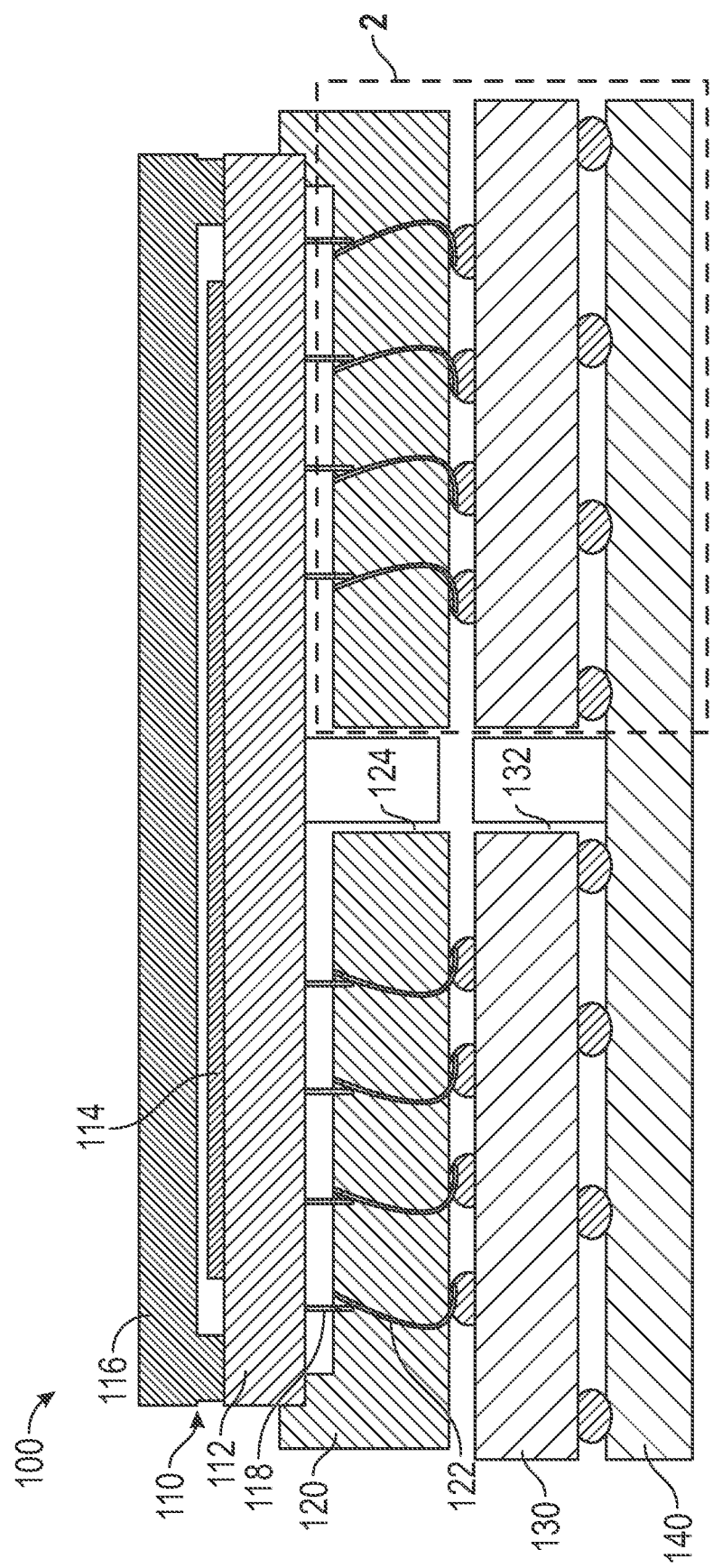
FIG. 1 illustrates a schematic view of an example of a first electronic device.

The present inventors have recognized, among other things, that a problem to be solved may include providing an enabling load between a semiconductor package and a socket of an electronic device. Additionally, the present inventors have recognized, among other things, that a problem to be solved may include providing an enabling force between the semiconductor package and the socket while minimizing the deflection of the semiconductor package and the socket. Further, the present inventors have recognized, among other things, that a problem to be solved may include facilitating the electrical interconnection between the semiconductor package and the socket when the semiconductor package and the socket are not planar (e.g., when the package or the socket are convex, concave, uneven, undulating, or the like). Still further, the present inventors have recognized, among other things, that a problem to be solved may include removing the physical interference of contacts in a socket. Still yet further, the present inventors have recognized, among other things, that a problem to be solved may include improving the data transfer rate of the electronic device.

The present subject matter may help provide a solution to this problem, such as by providing a socket that includes one or more contacts. The one or more contacts laterally displaces when engaged with a pillar of a semiconductor package. For instance, the contact may include an arm, and the arm may laterally displace when engaged with the pillar. The lateral displacement of the contact when engaged with the pillar provides an internal enabling force (e.g., a coupling force, interconnection force, or the like) between the semiconductor package and the socket. Accordingly, the internal enabling force facilitates the electrical interconnection (and communication) of the semiconductor package and the socket.

The internal enabling force provided by the lateral displacement of the contact when engage with the pillar may reduce the need to provide an external enabling force between the semiconductor package and the socket (e.g., with a coupling member that clamps the semiconductor package to the socket). An insertion force may be needed to engage the pillar with the contact, and laterally displace the contact to provide the internal enabling force. However, the insertion force may be removed, and the internal enabling force may couple the pillar with the contact. Accordingly, the internal enabling force may couple the semiconductor package with the socket, and an external enabling force may not be required.

Additionally, the reduction, or elimination, of an external enabling force may decrease deflection of the semiconductor package or the socket. Accordingly, physical dimensions of components of the semiconductor package or the socket may be reduced, and thereby reduce the size of the electronic device. Additionally, decreasing deflection of the semiconductor package or the socket may improve the electrical interconnection between the semiconductor package and the socket, for instance by reducing open circuits between the semiconductor package and the socket.

Further, the present subject matter may help improve the electrical interconnection between the semiconductor package and the socket when the semiconductor package or the socket is not planar. For instance, the pillar may include a pillar shaft, and the contact may engage with the pillar along a length of the pillar shaft. Accordingly, the pillar and/or the contact may be configured to accommodate for variations in the planarity of the semiconductor package or the socket. For instance, a first contact may engage with an upper portion of a first pillar shaft, and a second contact may engage with a lower portion of a second pillar shaft (in some examples, the first pillar shaft and the second pillar shaft have the same dimension).

Still further, the present subject matter may reduce interference between a plurality of contacts. For instance, a cantilever contact may include a cantilever beam that extends away from a base of the cantilever contact. Stated another way, the cantilever contact may include a beam where one end of the beam is coupled to a support and an opposite end of the beam is free to deflect vertically relative to the support. A first cantilever beam of a first cantilever contact may deflect within a first vertical range of motion. A second cantilever beam may deflect within a second vertical range of motion. In this example, the vertical range of motion for the first cantilever beam may intersect with the vertical range of motion for the second cantilever beam. Accordingly, the first cantilever beam may physically interfere with the second cantilever beam, and the physical interference may cause electrical shorting between the first cantilever contact and the second cantilever contact. Accordingly, the socket may need to be reconfigured to reduce the physical interference and thereby prevent electrical shorting (e.g., by increasing the physical dimensions of the socket to reduce the physical interference, and thereby increase the physical dimensions of the electronic device). The present subject matter may reduce physical interference between contacts of the socket by reducing the footprint of the contact, and thereby allowing a higher density of contacts per unit area.

Still yet further, the present subject matter may improve data transfer rates within the electronic device. For instance, a contact that laterally displaces may have physically smaller dimensions than a contact that includes a cantilever beam. Accordingly, the distance that an electrical signal travels in the contact that laterally displaces is less than the distance that the signal travels in a contact that includes a cantilever beam, and the data transfer rate in the electronic device is thereby improved. Additionally, the signal integrity of the electronic device may be improved because the contact may be sized and shaped to tune the impedance of the contact (e.g., to match the system impedance of the electronic device), and the laterally displacing contact may shift electrical resonances to a higher frequency range, where the resonances have less effect upon signal integrity.

This overview is intended to provide an overview of subject matter of the present patent application. This overview is not intended to provide an exclusive or exhaustive explanation of the invention. The detailed description continues to provide further information about the present patent application.

FIG. 1 illustrates a schematic view of an example of a first electronic device 100. The electronic device 100 may include a package 110. The package 110 may include a substrate 112, and the substrate 112 may include a dielectric material. Additionally, the substrate 112 may include one or more routing traces configured to route electrical signals in the substrate 112.

The package 110 may include a semiconductor die 114, and the die 114 may be coupled to the substrate 112. The semiconductor die 114 may be in electrical communication with the substrate 112. For instance, the semiconductor die 114 may be coupled to the substrate 112 with a ball grid array (e.g., one or more solder balls). Additionally, the package 110 may include an integrated heat spreader 116, and the integrated heat spreader 116 may dissipate heat generated by the semiconductor die 114 when the semiconductor die 114 is operated.

As discussed in greater detail herein, the package 110 may include one or more package interconnects, for instance the package 110 may include a pillar 118. The pillar 118 may project from the substrate 112, and may be configured to interconnect the package 110 with other components of the electronic device 100. Additionally, the pillar 118 may be in electrical communication with the semiconductor die 114 through the substrate 112.

The first electronic device 100 may include a socket 120, and the socket 120 may be configured to couple with the package 110. For instance, the socket 120 may mechanically couple with the package 110, and thereby retain the package 110 within the socket 120. Additionally, the socket 120 may electrically couple (e.g., interconnect) with the package 110, and the electrical coupling may establish one or more electrical communication pathways between the package 110 (e.g., the semiconductor die 114) and the socket 120.

The socket 120 may include one or more socket interconnects, for instance the socket 120 may include a contact 122. The one or more socket interconnects may be configured to interconnect with the one or more package interconnects. The one or more socket interconnects may correspond with (e.g., in size, shape, orientation, position, arrangement, or the like) the one or more package interconnects. In this disclosure, the socket 120 is described as including the contact 122 and the package 110 is described as including the pillar 118. However, the socket 120 may include the pillar 118, and the package 110 may include the contact 122. Additionally, the package interconnects may include a combination of the pillar 118 and the contact 122, and the socket interconnects may include a corresponding combination of the contact 122 and the pillar 118.

In some examples, the package 110 is coupled with the socket 120. The socket 120 may be sized and shaped to receive a portion of the package 110 (e.g., the package 110 may be seated in the socket 120, and the package 110 is thereby retained within the socket 120). Additionally, the pillar 118 may be received by the socket 120. For instance, the pillar 118 may be received within a port (e.g., the socket port 810 of FIG. 8) of the socket 120. Further, the socket 120 may define a first component gap 124, and the first component gap may receive a portion of the package 110 (e.g., one or more of a capacitor, an inductor, or the like coupled to the package 110).

The pillar 118 may engage with the contact 122 when the package 110 is coupled with the socket 120. The engagement of the pillar 118 with the socket 120 may laterally displace (e.g., bend, deflect, articulate, flex, yield, curve, or the like) the contact 122. The lateral displacement of the contact 122 may provide an internal enabling force between the pillar 118 and the contact 122. Stated another way, the lateral displacement of the contact 122 may bias the contact 122 against the pillar 118. Accordingly, the internal enabling force may couple the package 110 with the socket 120. The internal enabling force between the contact 122 and the pillar 118 is in contrast to an external enabling force where an external structure (e.g., a coupling member) applies a force to the package 110 and the socket 120 to thereby couple the package 110 with the socket 120.

Additionally, engagement of the contact 122 (e.g., the lateral displacement and resulting internal enabling force) may establish an electrical communication pathway between the pillar 118 and the contact 122. Accordingly, the engagement of the contact 122 and the pillar 118 may electrically interconnect the package 110 (e.g., the semiconductor die 114) and the socket 120. As described in greater detail herein, the socket 120 may route electrical signals to additional components of the electronic device 100.

The first electronic device 100 may include an interposer 130. The interposer 130 may provide a change in pitch for electrical connections within the electronic device 100. For instance, the interposer 130 may be positioned between the socket 120 and a motherboard 140. The interposer 130 may change the pitch of socket interconnects (e.g., pads, pins, contacts, or the like) included in the socket 120, and facilitate electrically interconnecting the socket 120 with motherboard interconnects of the motherboard 140. The motherboard 140 may be configured to route signals between the package 110 and additional components (e.g., memory, a display, power supplies, and the like). The interposer 130 may define a second component gap 132, and the second component gap 132 may be configured (e.g., sized and shaped) to receive a portion of the motherboard 140 (e.g., one or more of a capacitor, an inductor, or the like coupled to the motherboard 140).

Figure 2:
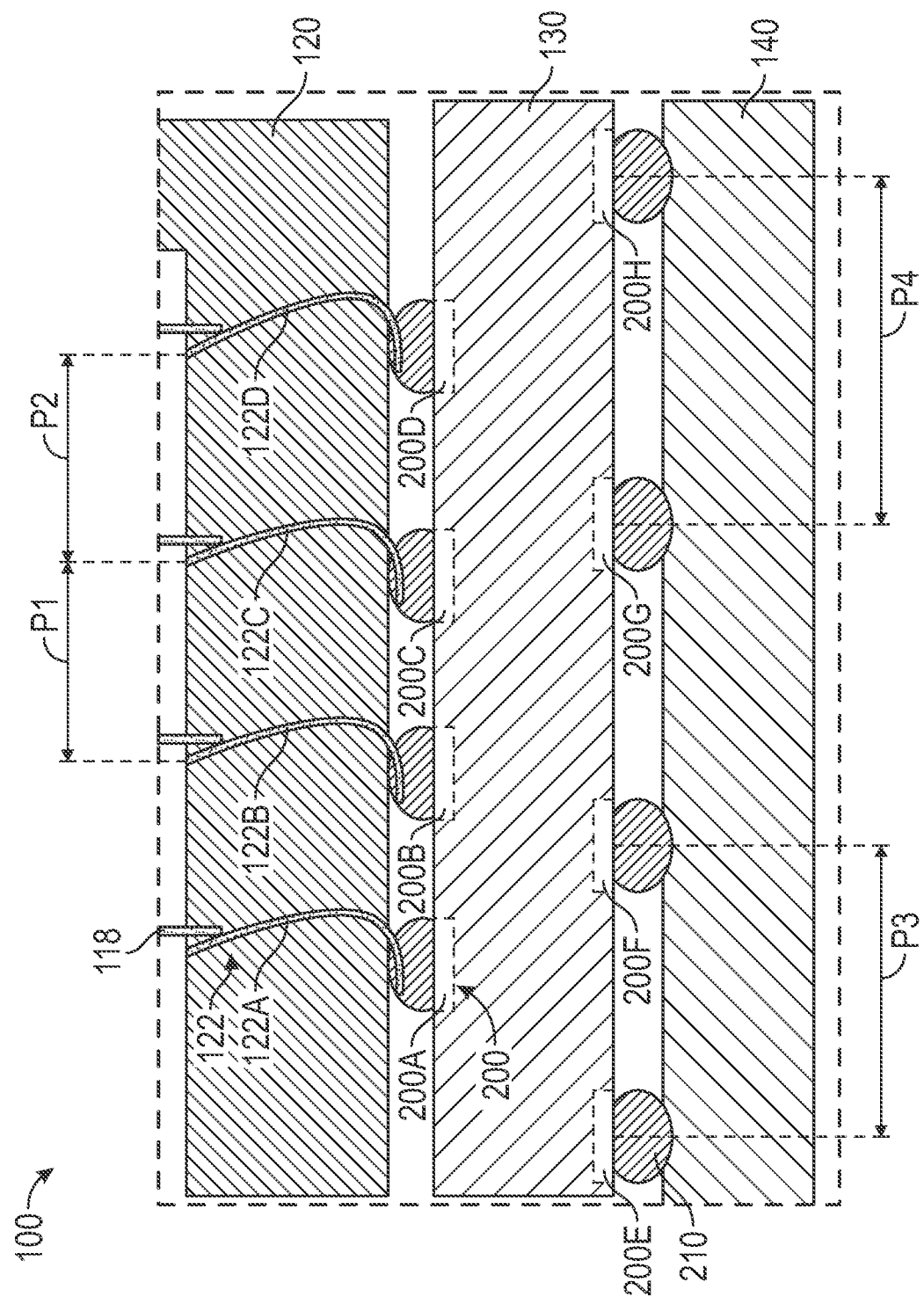
FIG. 2 illustrates a detailed view of the first electronic device of FIG. 1.

FIG. 2 illustrates a detailed view of the first electronic device 100 of FIG. 1. As described herein, the socket 120 may include socket interconnects. The socket interconnects may include a first contact 122A, a second contact 122B, a third contact 122C, and a fourth contact 122D (collectively contacts 122). As described herein, the socket interconnects may engage with the package interconnects. For example, the first contact 122A may laterally displace when engaged with the pillar 118. In the example shown in FIG. 2, the contact 122A is laterally displaced in a first direction (e.g., left) when engaged with the pillar 118.

The components of the electronic device 100 may have varying pitches. In an example, the contact 122B may be spaced from the contact 122C at a first pitch P1. The first pitch may be within a range of 0.4 millimeters to 0.6 millimeters, but the present subject matter is not so limited. The contact 122C may be spaced from the contact 122D at a second pitch P2. In some examples, the first pitch P1 may be different than the second pitch P2 (e.g., the second pitch P2 may be greater than, or less than, the first pitch P1).

As described herein, the interposer 130 may provide a change in pitch for electrical connections within the electronic device 100. The interposer 130 may include one or more interposer interconnects 200 (e.g., a pad or the like). In an example, a first interconnect 200A, a second interconnect 200B, a third interconnect 200C, a fourth interconnect 200D, a fifth interconnect 200E, a sixth interconnect 200F, a seventh interconnect 200G, and an eighth interconnect 200H. The one or more interposer interconnects 200 may be configured to couple with the socket interconnects and may be configured to couple with the motherboard interconnects (e.g., with a solder ball 210). The socket interconnects may be configured at the first pitch P1 or the second pitch P2.

In this example, because the interposer interconnects 200 are configured to be coupled with the socket interconnects (e.g., the contacts 122A, 122B, 122C, and 122D), the interposer interconnects 200A, 200B, 200C, and 200D may correspondingly be configured at the first pitch P1 or the second pitch P2. Additionally, the interposer 130 may provide a change in pitch from a first (e.g., top) side of the interposer 130 to a second (e.g., bottom) side of the interposer 130. For example, the interconnect 200E may be spaced from the interconnect 200F at a third pitch P3. The third pitch P3 may be within a range of 0.9 millimeters to 1.1. millimeters, but the present subject matter is not so limited. The interconnect 200G may be spaced from the interconnect 200H at a fourth pitch P4. In some examples, the third pitch P3 may be different than the fourth pitch P4 (e.g., the third pitch P3 may be less than, or greater than, the fourth pitch P4).

Figure 3:
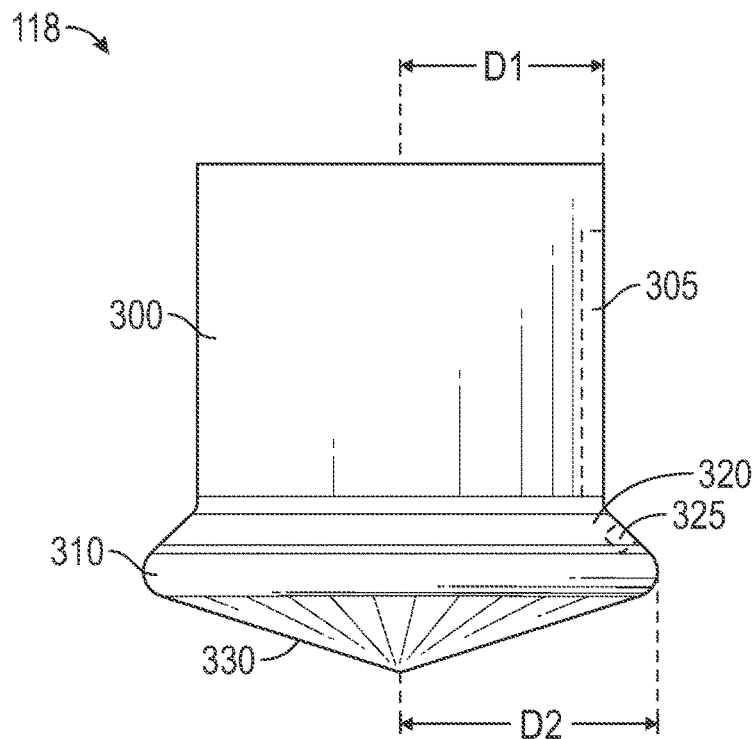
FIG. 3 illustrates a side view of one example of a pillar.

FIG. 3 illustrates a side view of one example of the pillar 118. The pillar 118 may include a pillar shaft 300. The pillar shaft 300 may have a first lateral dimension D1. In one example, the first dimension D1 is a radius, and the pillar 118 has a circular cross-section. In another example, the pillar 118 has a rectangular cross-section. In yet another example, the pillar 118 has an irregular cross-section (e.g., the pillar 118 defines a groove 305 configured to receive a portion of the contact 122 shown in FIG. 1-2 or 4-6). The pillar shaft 300 includes a length dimension (e.g., 0.3 millimeters), and the pillar 118 may have an overall length of 0.4 millimeters, but the present subject matter is not so limited.

As described herein, the pillar 118 may be configured to engage with the contact 122 (shown in FIGS. 1-2 and 4-6). The contact 122 may engage with one or more features of the pillar 118. For example, the contact 122 may engage with the pillar shaft 300. The engagement of the contact 122 with the pillar shaft 300 may laterally displace the contact 122, and may provide an internal enabling force.

The pillar 118 may include a locking nose 310. As described in greater detail herein, the locking nose 310 may be configured to engage with the contact 122 and substantially inhibit the translation (e.g., a vertical translation) of the contact 122 with respect to the pillar 118. The locking nose 310 may have a second lateral dimension D2. The second lateral dimension D2 may be greater than the first lateral dimension D1. In some examples, pillar 118 includes an inclined portion 320 between the pillar shaft 300 and the locking nose 310. The inclined portion 320 may provide a gradual change in dimension from the pillar shaft 300 to the locking nose 310. Stated another way, the inclined portion 320 may transition between the first lateral dimension D1 and the second lateral dimension D2. The contact 122 may engage with the inclined portion 320. As shown in FIG. 3, the inclined portion 320 may be linear. However, the inclined portion 320 may be curved (e.g., concave) or irregularly shaped (e.g., defining a groove 325 to receive a portion of the contact 122, for instance the hook portion 440 shown in FIG. 4).

The pillar 118 may include a ramp portion 330. As discussed in greater detail herein, the ramp portion 330 may provide a transition to the locking nose 310, and the ramp portion 330 may guide the contact 122 (shown in FIGS. 1-2 and 4-6) toward the locking nose 310. For example, the ramp portion 330 may engage with the contact 122 and the engagement of the contact 122 with the ramp portion may laterally displace the contact 122. In some examples, the ramp portion 330 extends from a central axis of the pillar 118 toward the locking nose 310. As shown in FIG. 3, the ramp portion 330 is linear. However, the ramp portion may be curved (e.g., convex) or irregularly shaped (e.g., stepped).

The pillar 118 may be electrodeposited onto, and thereby coupled to, the substrate 112. For instance, the pillar shaft 300 may be electroplated onto the substrate 112. Additionally, the inclined portion 320 may optionally be electroplated onto the pillar shaft 300. Further, the locking nose 310 may be electroplated onto the pillar shaft 300 or the inclined portion 320. Still further, the ramp portion 330 may be electrodeposited onto the pillar shaft 300, the locking nose 310, or the inclined portion 320.

Figure 4:
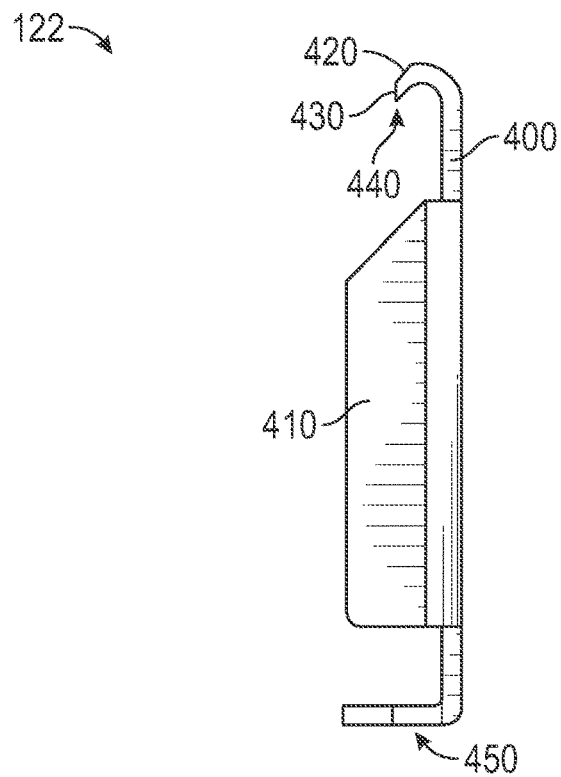
FIG. 4 illustrates a side view of one example of a contact.

FIG. 4 illustrates a side view of one example of the contact 122. The contact 122 may include an arm 400. In an example, the arm 400 may be configured to laterally displace relative to a contact body 410. In another example, the arm 400 and a portion of the contact body 410 laterally displace when engaged with the pillar 118. The contact body 410 may be coupled to the socket 120, and the coupling of the contact body 410 with the socket 120 may retain the contact 122 within the socket 120.

The contact 122 may include a ramp portion 420. For instance, the ramp portion 420 may be included in the arm 400. The ramp portion 420 may engage with the pillar 118 (shown in FIG. 3) and thereby help facilitate the lateral displacement of the contact 122 (e.g., the arm 400). In an example, the ramp portion 420 of the contact 122 may slidingly engage with the ramp portion 330 of the pillar 118 (shown in FIG. 3). The sliding engagement of the ramp portion 420 with the ramp portion 330 may allow help the arm 400 to laterally displace and thereby engage with the pillar shaft 300 (shown in FIG. 3).

The contact 122 may include an engaging portion 430, and the engaging portion 430 may engage with the pillar shaft 300. In an example, the engagement of the engaging portion 430 with the pillar shaft (shown in FIG. 3) may electrically interconnect the pillar 118 with the contact 122. The engaging portion 430 may be biased against the pillar shaft 330. For instance, the lateral displacement of the arm 400 (and Young's Modulus of the arm 400) may bias the engaging portion 430 toward the pillar shaft 330 and thereby provide an internal enabling force between the contact 122 and the pillar 118.

The contact 122 may include a hook portion 440, and the hook portion 440 may engage with the pillar 118 to thereby inhibit the translation of the contact 122 with respect to the pillar 118 (e.g., vertically). As described in greater detail herein, the hook portion 440 may engage with the inclined portion 320 (shown in FIG. 3) or the locking nose 310 to inhibit the translation of the contact 122 with respect to the pillar 118. The hook portion 440 may engage with the ramp portion 330 (shown in FIG. 3) and translate past the locking nose 310 (shown in FIG. 3). The arm 400 may bias the hook portion 440 toward the pillar shaft 300, and the biasing of the hook portion may inhibit the translation of the contact 122 with respect to the pillar 118 because the hook portion 440 engages with locking nose 310. The contact 122 may include a socket interconnect 450, and the socket interconnect 450 may be configured to couple with interposer interconnects 200 or motherboard interconnects 700 (shown in FIG. 7).

FIG. 5 illustrates a side view of the contact 122 engaged with the pillar 118. As described herein, the contact 122 may slidingly engage with the pillar 118, for instance the ramp portion 420 of the contact may slidingly engage with the ramp portion 330 of the pillar. Accordingly, the sliding engagement of the contact 122 with the pillar may laterally displace the contact (e.g., the arm 400) and the contact 122 may displace (e.g., deflect) past, and engage with, the locking nose 310.

FIG. 6 illustrates a side view of the contact 122 laterally displaced and engaged with the pillar 118. As described herein, the contact 122 may laterally displace when engaged with the pillar 118. For instance, the arm 400 may laterally displace relative to the contact body 410. The lateral displacement of the contact 122 allows the contact 122 to engage with portions of the pillar (e.g., the locking nose 310 or the pillar shaft 300). The lateral displacement of the contact 122 when engaged with the pillar 118 provides an internal enabling force (e.g., the force produced as a result of the contact 122 being biased against the pillar 118). Accordingly, the lateral displacement of the contact 122 when the contact 122 is engaged with the pillar 118 facilitates the electrical interconnection of the pillar 118 with the contact 122 (and the package 110 with the socket 120).

In contrast, an external enabling force may be needed to facilitate the electrical interconnection of the package 110 with the socket 120 (shown in FIG. 1) if the contact 122 does not laterally displace when engaged with the pillar 118. For instance, a coupling member may be engage with the package 110 and the motherboard 140 (shown in FIG. 1), and the coupling member may clamp the package 110 against the socket 120. If the contact 122 is configured to laterally displace when engaged with the pillar 118, the resulting forces therebetween may provide an internal enabling force. The internal enabling force provided by the lateral displacement may reduce the need for an external enabling force. Accordingly, the present subject matter helps improve the electrical interconnection of the package 110 with the socket 120.

Further, the contact 122 may engage with the pillar 118 along a length of the pillar shaft 300. In an example, the package 110 (or the socket 120, shown in FIG. 1) may not be planar, and as a result of the lack of planarity, the pillars 118 of the package 110 may not be at the same elevation with respect to the socket 120. For instance, the package 110 may include a plurality of pillars 118, and the position of the pillars 118 may vary. Accordingly, the contact 122A (shown in FIG. 2) may engage with an upper portion of the pillar shaft 300 (e.g., remote from the locking nose 310). Additionally, the contact 122D may engage with a lower portion of the pillar shaft 300 (e.g., as shown in FIG. 6, where the hook portion 440 is proximate the locking nose 310). The dimensions of the pillar 118 (e.g., a length of the pillar shaft 300) or the contact 122 (e.g., a length of the arm 400) may be configured to accommodate for the lack of planarity of the package 110 (or the socket 120). Accordingly, the present subject matter facilitates the electrical interconnection of components of the electronic device if there is a lack of planarity in (or between) the components.

Still further, and as described herein, the contact 122 may include a hook portion 440, and the hook portion 440 may be included in the arm 400 of the contact 122. The hook portion 440 may engage with the locking nose 310, and the engagement of the hook portion 440 with the locking nose 310 may inhibit the translation (e.g., vertical translation) of the contact 122 with respect to the pillar 118. Accordingly, the engagement of the hook portion 440 may inhibit the translation of the package 110 with respect to the socket (e.g., due to vibrations, thermal expansion, or the like).

Figure 7:
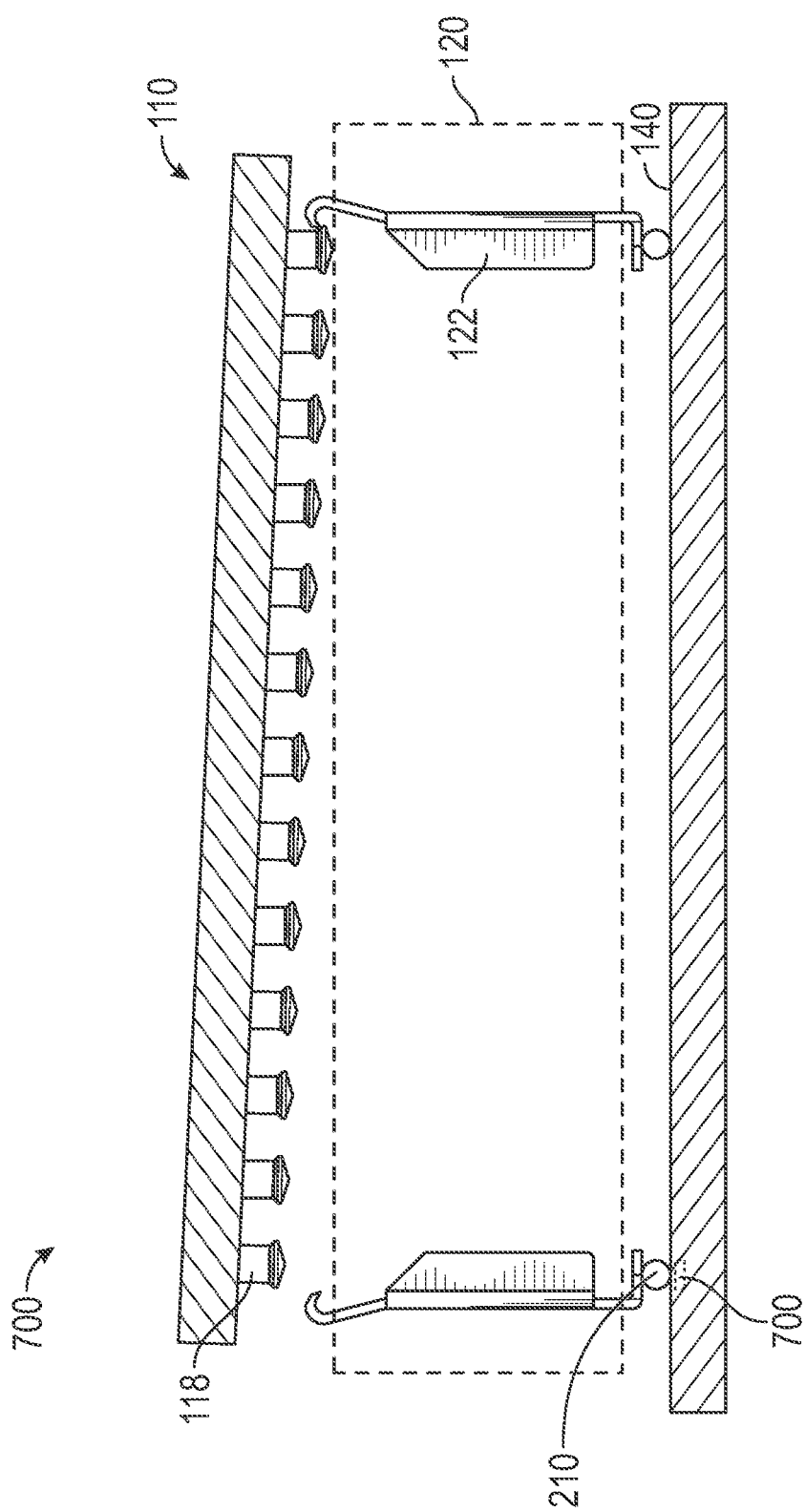
FIG. 7 illustrates a schematic view of an example of a second electronic device.

FIG. 7 illustrates a schematic view of an example of a second electronic device 700. In some examples, the socket 120 is coupled to the motherboard 140. For clarity, the socket 120 is shown in broken lines in FIG. 7. In contrast with the first electronic device 100 (shown in FIG. 1), the electronic device 700 may not include the interposer 130. Accordingly, the socket interconnect 450 (shown in FIG. 4) may be coupled with a motherboard interconnect 700 (e.g., with the solder ball 210).

The pillars 118 of the package 110 may be coupled sequentially with the socket 120. For instance, a first end of the package 110 may be engaged with a first end of the socket 120, and the pillars 118 on the first end of the package 110 may be engaged with the contacts 122 on the first end of the socket 120. The sequential coupling of the package 110 with the socket 120 may reduce the amount of force required to couple the package 110 with the socket 120. For example, by reducing the number of pillars 118 and contacts 122 simultaneously engaging with each other, the amount of insertion force (e.g., pushing, pressing, or the like) required to couple the package 110 with the socket 120 is thereby reduced. Additionally, because the contacts 122 laterally displace when engaged with the pillars 118 (and provide an internal enabling force), the contacts 122 remain coupled with pillars 118 when the insertion force is removed, and thereby allow the sequential coupling of the package 110 with the socket 120.

Figure 8:
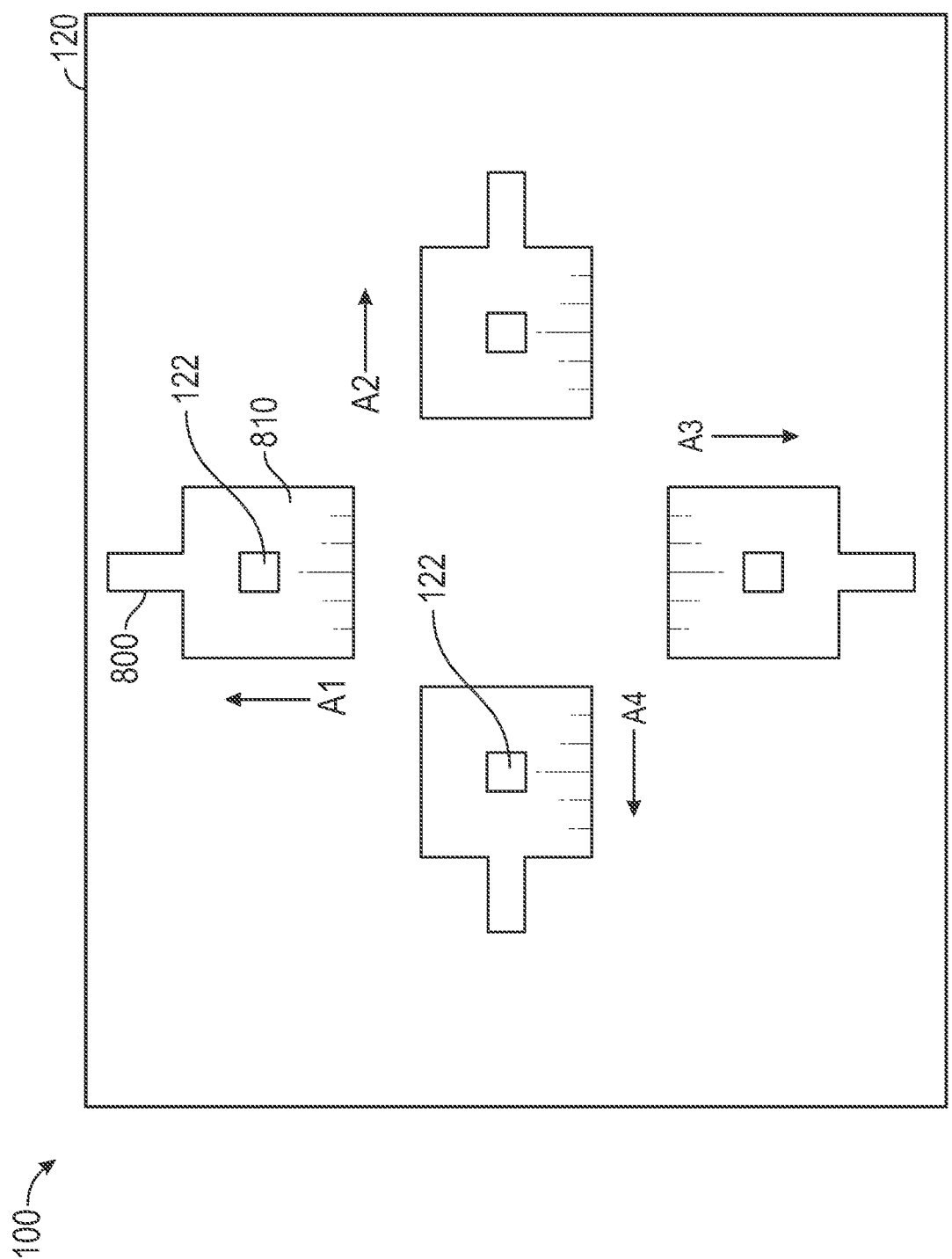
FIG. 8 illustrates a plan view of one example of a socket.

FIG. 8 illustrates a plan view of one example of the socket 120. The socket 120 may include a recess 800, and the recess 800 may be configured to allow the contact 122 to laterally displace by receiving the contact 122 within the recess 800. For example, the contact 122 may laterally displace in a first direction A1, from a socket port 810 into the recess 800. The socket port 810 may receive the pillar 118 (shown in FIGS. 1-3, and 5-7), and the engagement (e.g., sliding engagement) of the pillar 118 with the contact 122 may laterally displace the contact 122 into the recess 800.

The socket 120 may be configured to allow the contacts 122 to laterally displace in one or more directions. For instance, the contact 122 may laterally displace in the first direction A1, a second direction A2, a third direction A3, and/or a fourth direction A4. The first direction A1, second direction A2, the third direction A3, and the fourth direction A4 may be different. In an example, the second direction may be perpendicular to (e.g., orthogonal, or offset by 90 degrees) with respect to the first direction A1. In another example, the third direction A3 may be opposite (e.g., offset by 180 degrees) with respect to the first direction A1. In yet another example, the fourth direction A4 may be at an angle (e.g., 40 degrees) with respect to the first direction A1.

Configuring the contacts 122 to laterally displace in one or more directions may allow for a balancing of the internal enabling forces provided by the lateral displacement of the contacts 122. Additionally, the contact 122 may include a plurality of arms (e.g., two or more of the arm 400 shown in FIG. 4), and the plurality of arms may allow for a balancing of the internal enabling forces provided by the contact 122. Stated another way, the contacts 122 of the socket 120 may be configured to symmetrically load the package 110, or the pillars 118.

Figure 9:
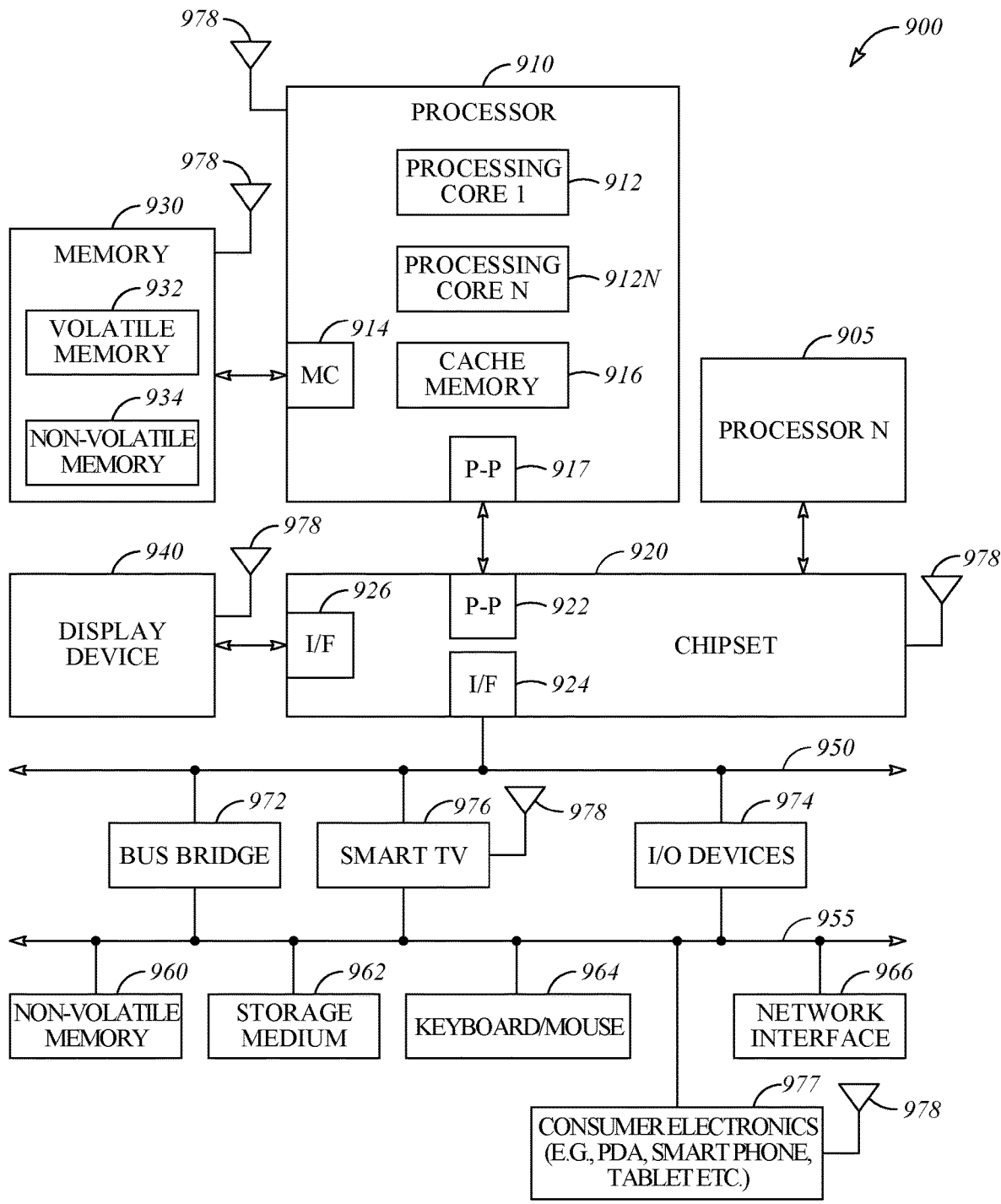
FIG. 9 illustrates a system level diagram, depicting an example of a third electronic device (e.g., system).

FIG. 9 illustrates a system level diagram, depicting an example of a third electronic device (e.g., system) including one or more components of the first electronic device 100 or the second electronic device 700 as described in the present disclosure. FIG. 9 is included to show an example of a higher level device application for the first electronic device 100 or the second electronic device 700. In one embodiment, system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 900 is a system on a chip (SOC) system.

In one embodiment, processor 910 has one or more processor cores 912 and 912N, where 912N represents the Nth processor core inside processor 910 where N is a positive integer. In one embodiment, system 900 includes multiple processors including 910 and 905, where processor 905 has logic similar or identical to the logic of processor 910. In some embodiments, processing core 912 includes, but is not limited to, pre-fetch logic to fetch instructions, decode logic to decode the instructions, execution logic to execute instructions and the like. In some embodiments, processor 910 has a cache memory 916 to cache instructions and/or data for system 900. Cache memory 916 may be organized into a hierarchal structure including one or more levels of cache memory.

In some embodiments, processor 910 includes a memory controller 914, which is operable to perform functions that enable the processor 910 to access and communicate with memory 930 that includes a volatile memory 932 and/or a non-volatile memory 934. In some embodiments, processor 910 is coupled with memory 930 and chipset 920. Processor 910 may also be coupled to a wireless antenna 978 to communicate with any device configured to transmit and/or receive wireless signals. In one embodiment, an interface for wireless antenna 978 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 934 includes, but is not limited to, flash memory, phase change memory (PCM), read-only memory (ROM), electrically erasable programmable read-only memory (EEPROM), or any other type of non-volatile memory device.

Memory 930 stores information and instructions to be executed by processor 910. In one embodiment, memory 930 may also store temporary variables or other intermediate information while processor 910 is executing instructions. In the illustrated embodiment, chipset 920 connects with processor 910 via Point-to-Point (PtP or P-P) interfaces 917 and 922. Chipset 920 enables processor 910 to connect to other elements in system 900. In some embodiments of the example system, interfaces 917 and 922 operate in accordance with a PtP communication protocol such as the Intel® QuickPath Interconnect (QPI) or the like. In other embodiments, a different interconnect may be used.

In some embodiments, chipset 920 is operable to communicate with processor 910, 905N, display device 940, and other devices, including a bus bridge 972, a smart TV 976, I/O devices 974, nonvolatile memory 960, a storage medium (such as one or more mass storage devices) 962, a keyboard/mouse 964, a network interface 966, and various forms of consumer electronics 977 (such as a PDA, smart phone, tablet etc.), etc. In one embodiment, chipset 920 couples with these devices through an interface 924. Chipset 920 may also be coupled to a wireless antenna 978 to communicate with any device configured to transmit and/or receive wireless signals.

Chipset 920 connects to display device 940 via interface 926. Display 940 may be, for example, a liquid crystal display (LCD), a plasma display, cathode ray tube (CRT) display, or any other form of visual display device. In some embodiments of the example system, processor 910 and chipset 920 are merged into a single SOC. In addition, chipset 920 connects to one or more buses 950 and 955 that interconnect various system elements, such as I/O devices 974, nonvolatile memory 960, storage medium 962, a keyboard/mouse 964, and network interface 966. Buses 950 and 955 may be interconnected together via a bus bridge 972.

In one embodiment, mass storage device 962 includes, but is not limited to, a solid state drive, a hard disk drive, a universal serial bus flash memory drive, or any other form of computer data storage medium. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are depicted as separate blocks within the system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) may be incorporated into processor core 912.

Various Notes & Examples

Aspect 1 may include or use subject matter (such as an apparatus, a system, a device, a method, a means for performing acts, or a device readable medium including instructions that, when performed by the device, may cause the device to perform acts, or an article of manufacture), such as may include or use an electronic device, comprising: a semiconductor package, including: a package substrate including a dielectric material, a semiconductor die coupled to the package substrate, a plurality of package interconnects including a first pillar extending from a surface of the package substrate; and a socket configured to couple with the semiconductor package, the socket including: a plurality of socket interconnects configured to engage with the package interconnects, wherein: the plurality of socket interconnects includes a first contact, and the first contact includes an arm, the arm of the first contact is configured to engage with the first pillar, and the arm is configured to laterally displace when engaged with the first pillar, and the engagement of the arm with the first pillar establishes an electrical communication pathway between the semiconductor package and the socket.

Aspect 2 may include or use, or may optionally be combined with the subject matter of Aspect 1, to optionally include or use wherein the first pillar includes: a pillar shaft having a first lateral dimension, a locking nose having a second lateral dimension, and the second lateral dimension is greater than the first lateral dimension, a ramp portion coupled to the locking nose, wherein the pillar ramp includes an inclined surface extending toward a central axis of the first pillar, and the ramp portion is configured to engage with the first contact and provide a transition to the locking nose.

Aspect 3 may include or use, or may optionally be combined with the subject matter of Aspect 2 to optionally include or use wherein the first contact is configured to slidingly engage with the pillar ramp, and the sliding engagement of the first contact with the pillar ramp laterally displaces the arm of the first contact.

Aspect 4 may include or use, or may optionally be combined with the subject matter of Aspects 2 or 3 to optionally include or use wherein the first contact includes a hook portion coupled to the arm of the first contact, and the hook portion is configured to engage with the pillar shaft or the locking region, and the engagement of the hook portion with the pillar shaft or the locking region substantially inhibits the translation of the first pillar with respect to the first contact.

Aspect 5 may include or use, or may optionally be combined with the subject matter of one or any combination of Aspects 2 through 4 to optionally include or use wherein the first contact is engaged with the first pillar, and the first contact is biased toward the pillar shaft or the locking nose.

Aspect 6 may include or use, or may optionally be combined with the subject matter of one or any combination of Aspects 1 through 3 to optionally include or use wherein: the plurality of package interconnects includes a second pillar, the arm of the first contact is a first arm, the plurality of socket interconnects includes a second contact including a second arm, and the second arm is configured to engage with the second pillar, the first arm is configured to laterally displace in a first direction, and the second arm is configured to laterally displace in a second direction.

Aspect 7 may include or use, or may optionally be combined with the subject matter of Aspect 6 to optionally include or use wherein: the plurality of package interconnects includes a third pillar, the plurality of socket interconnects includes a third contact including a third arm, and the third arm is configured to engage with the third pillar, the third arm is configured to laterally displace in a third direction.

Aspect 8 may include or use, or may optionally be combined with the subject matter of one or any combination of Aspects 1 through 7 to optionally include or use wherein: the plurality of package interconnects includes a plurality of pillars, and the plurality of pillars includes the first pillar, and the plurality of socket interconnects includes a plurality of contacts, and the plurality of contacts includes the first contact.

Aspect 9 may include or use, or may optionally be combined with the subject matter of one or any combination of Aspects 1 through 8 to optionally include or use wherein the socket defines a recess, and the recess is configured to receive the arm of the first contact when the arm is laterally displaced.

Aspect 10 may include or use subject matter (such as an apparatus, a system, a device, a method, a means for performing acts, or a device readable medium including instructions that, when performed by the device, may cause the device to perform acts, or an article of manufacture), such as may include or use an electronic device, comprising: a semiconductor package, including: a package substrate including a dielectric material, a semiconductor die coupled to the package substrate, a plurality of package interconnects including a first pillar extending from a surface of the package substrate; a motherboard including one or more motherboard interconnects; and a socket, wherein the socket is configured to couple with the semiconductor package, the socket including: a plurality of socket interconnects configured to engage with the package interconnects, wherein: the plurality of socket interconnects includes a first contact, and the first contact includes a first arm, the first arm is configured to engage with the first pillar, and the first arm is configured to laterally displace when engaged with the first pillar, and the engagement of the first arm with the first pillar establishes an electrical communication pathway between the semiconductor package and the socket.

Aspect 11 may include or use, or may optionally be combined with the subject matter of Aspect 10, to optionally include or use an interposer, wherein: the interposer includes a first set of interposer interconnects, the interposer includes a second set of interposer interconnects, the interposer is configured to be positioned between the socket and the motherboard, the first set of interposer interconnects are configured to be coupled to the plurality of socket interconnects, and the second set of interposer interconnects are configured to be coupled to the motherboard interconnects of the motherboard.

Aspect 12 may include or use, or may optionally be combined with the subject matter of Aspect 11 to optionally include or use wherein: the first set of interposer interconnects are spaced at a first pitch, the second set of interposer interconnects are spaced at a second pitch, and wherein the first pitch is different than the second pitch.

Aspect 13 may include or use, or may optionally be combined with the subject matter of Aspect 12 to optionally include or use wherein the first pitch is smaller than the second pitch.

Aspect 14 may include or use, or may optionally be combined with the subject matter of one or any combination of Aspects 10 through 13 to optionally include or use a second contact that includes a second arm, and the second arm is spaced from the first arm at a first pitch, and wherein: the first contact includes a first interconnect configured to couple with the motherboard interconnects or the interposer interconnects, the second contact includes a second interconnect configured to couple with a motherboard interconnect of the one or more motherboard interconnects or an interposer interconnects, the first interconnect is spaced from the second interconnect at a second pitch, and the second pitch is different than the first pitch.

Aspect 15 may include or use, or may optionally be combined with the subject matter of Aspect 14 to optionally include or use wherein the first pitch is smaller than the second pitch.

Aspect 16 may include or use, or may optionally be combined with the subject matter of one or any combination of Aspects 10 through 15 to optionally include or use a second contact that includes a second arm, and the second arm is spaced from the first arm at a first pitch; a third contact that includes a third arm, and the third arm is spaced from the first arm at a second pitch; and wherein the first pitch is different than the second pitch.

Aspect 17 may include or use, or may optionally be combined with the subject matter of one or any combination of Aspects 10 through 16 to optionally include or use wherein the socket is coupled to the motherboard.

Aspect 18 may include or use, or may optionally be combined with the subject matter of one or any combination of Aspects 10 through 17 to optionally include or use wherein the coupling of the semiconductor package with the socket does not include mechanically coupling the semiconductor package with a portion of the motherboard.

Aspect 19 may include or use, or may optionally be combined with the subject matter of one or any combination of Aspects 10 through 18 to optionally include or use wherein the coupling of the semiconductor package with the socket is only provided by the engagement of the socket interconnects with the package interconnects.

Aspect 20 may include or use, or may optionally be combined with the subject matter of one or any combination of Aspects 10 through 19 to optionally include or use wherein: the first contact includes a second arm, the second arm is configured to engage with the first pillar, the first arm is configured to laterally displace in a first direction when engaged with the first pillar, the second arm is configured to laterally displace in a second direction when engaged with the first pillar, and lateral displacement of the first arm in the first direction is different than the lateral displacement of the second arm in the second direction.

Aspect 21 may include or use, or may optionally be combined with any portion or combination of any portions of any one or more of Aspects 1 through 20 to include or use, subject matter that may include means for performing any one or more of the functions of Aspects 1 through 20, or a machine-readable medium including instructions that, when performed by a machine, cause the machine to perform any one or more of the functions of Aspects 1 through 20.

Each of these non-limiting Aspects may stand on its own, or may be combined in various permutations or combinations with one or more of the other Aspects.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic device, comprising:
   a semiconductor package, including:
      a package substrate including a dielectric material,
      a semiconductor die coupled to the package substrate,
      a plurality of package interconnects including a first pillar extending from a surface of the package substrate; and
   a socket configured to couple with the semiconductor package, the socket including:
      a plurality of socket interconnects configured to engage with the package interconnects, wherein:
         the plurality of socket interconnects includes a first contact, and the first contact includes an arm,
         the arm of the first contact is configured to engage with the first pillar, and the arm is configured to laterally displace when engaged with the first pillar, and
         the engagement of the arm with the first pillar establishes an electrical communication pathway between the semiconductor package and the socket.

2. The electronic device of claim 1, wherein the first pillar includes:
   a pillar shaft having a first lateral dimension,
   a locking nose having a second lateral dimension, and the second lateral dimension is greater than the first lateral dimension,
   a ramp portion coupled to the locking nose, wherein the ramp portion includes an inclined surface extending toward a central axis of the first pillar, and the ramp portion is configured to engage with the first contact and provide a transition to the locking nose.

3. The electronic device of claim 2, wherein the first contact is configured to slidingly engage with the ramp portion, and the sliding engagement of the first contact with the ramp portion laterally displaces the arm of the first contact.

4. The electronic device of claim 2, wherein the first contact includes a hook portion coupled to the arm of the first contact, and the hook portion is configured to engage with the pillar shaft or the locking region, and the engagement of the hook portion with the pillar shaft or the locking region substantially inhibits the translation of the first pillar with respect to the first contact.

5. The electronic device of claim 2, wherein the first contact is engaged with the first pillar, and the first contact is biased toward the pillar shaft or the locking nose.

6. The electronic device of claim 1, wherein:
   the plurality of package interconnects includes a second pillar,
   the arm of the first contact is a first arm,
   the plurality of socket interconnects includes a second contact including a second arm, and the second arm is configured to engage with the second pillar,
   the first arm is configured to laterally displace in a first direction, and
   the second arm is configured to laterally displace in a second direction.

7. The electronic device of claim 6, wherein:
   the plurality of package interconnects includes a third pillar,
   the plurality of socket interconnects includes a third contact including a third arm, and the third arm is configured to engage with the third pillar,
   the third arm is configured to laterally displace in a third direction.

8. The electronic device of claim 1, wherein:
   the plurality of package interconnects includes a plurality of pillars, and the plurality of pillars includes the first pillar, and
   the plurality of socket interconnects includes a plurality of contacts, and the plurality of contacts includes the first contact.

9. The electronic device of claim 1, wherein the socket defines a recess, and the recess is configured to receive the arm of the first contact when the arm is laterally displaced.

10. An electronic device, comprising:
    a semiconductor package, including:
       a package substrate including a dielectric material,
       a semiconductor die coupled to the package substrate,
       a plurality of package interconnects including a first pillar extending from a surface of the package substrate;
    a motherboard including one or more motherboard interconnects; and
    a socket, wherein the socket is configured to couple with the semiconductor package, the socket including:
       a plurality of socket interconnects configured to engage with the package interconnects, wherein:
          the plurality of socket interconnects includes a first contact, and the first contact includes a first arm,
          the first arm is configured to engage with the first pillar, and the first arm is configured to laterally displace when engaged with the first pillar, and
          the engagement of the first arm with the first pillar establishes an electrical communication pathway between the semiconductor package and the socket.

11. The electronic device of claim 10, further comprising an interposer, wherein:
    the interposer includes a first set of interposer interconnects,
    the interposer includes a second set of interposer interconnects,
    the interposer is configured to be positioned between the socket and the motherboard,
    the first set of interposer interconnects are configured to be coupled to the plurality of socket interconnects, and
    the second set of interposer interconnects are configured to be coupled to the motherboard interconnects of the motherboard.

12. The electronic device of claim 11, wherein:
    the first set of interposer interconnects are spaced at a first pitch,
    the second set of interposer interconnects are spaced at a second pitch, and
    wherein the first pitch is different than the second pitch.

13. The electronic device of claim 12, wherein the first pitch is smaller than the second pitch.

14. The electronic device of claim 10, further comprising a second contact that includes a second arm, and the second arm is spaced from the first arm at a first pitch, and wherein:
    the first contact includes a first interconnect configured to couple with the motherboard interconnects or the interposer interconnects,
    the second contact includes a second interconnect configured to couple with a motherboard interconnect of the one or more motherboard interconnects or an interposer interconnects,
    the first interconnect is spaced from the second interconnect at a second pitch, and
    the second pitch is different than the first pitch.

15. The electronic device of claim 14, wherein the first pitch is smaller than the second pitch.

16. The electronic device of claim 10, further comprising:
a second contact that includes a second arm, and the second arm is spaced from the first arm at a first pitch;
a third contact that includes a third arm, and the third arm is spaced from the first arm at a second pitch; and
wherein the first pitch is different than the second pitch.

17. The electronic device of claim 10, wherein the socket is coupled to the motherboard.

18. The electronic device of claim 10, wherein the coupling of the semiconductor package with the socket does not include mechanically coupling the semiconductor package with a portion of the motherboard.

19. The electronic device of claim 10, wherein the coupling of the semiconductor package with the socket is only provided by the engagement of the socket interconnects with the package interconnects.

20. The electronic device of claim 10, wherein:
the first contact includes a second arm,
the second arm is configured to engage with the first pillar,
the first arm is configured to laterally displace in a first direction when engaged with the first pillar,
the second arm is configured to laterally displace in a second direction when engaged with the first pillar,
and lateral displacement of the first arm in the first direction is different than the lateral displacement of the second arm in the second direction.

* * * * *